United States Patent
Laakkonen et al.

(10) Patent No.: US 8,092,723 B2
(45) Date of Patent: Jan. 10, 2012

(54) METHOD OF PRODUCING A DIFFRACTION GRATING ELEMENT

(75) Inventors: Pasi Laakkonen, Joensuu (FI); Tapani Levola, Tampere (FI)

(73) Assignee: Nanocomp Oy Ltd, Lehmo (FI)

( * ) Notice: Subject to any disclaimer, the term of this patent is extended or adjusted under 35 U.S.C. 154(b) by 0 days.

(21) Appl. No.: 12/094,232

(22) PCT Filed: Nov. 18, 2005

(86) PCT No.: PCT/FI2005/050422
§ 371 (c)(1),
(2), (4) Date: Oct. 7, 2008

(87) PCT Pub. No.: WO2007/057500
PCT Pub. Date: May 24, 2007

(65) Prior Publication Data
US 2009/0224416 A1 Sep. 10, 2009

(51) Int. Cl.
*B29D 11/00* (2006.01)
*G02B 5/18* (2006.01)
(52) U.S. Cl. ..................... 264/1.31; 264/2.5
(58) Field of Classification Search .......... 264/1.31
See application file for complete search history.

(56) References Cited

U.S. PATENT DOCUMENTS

| | | | | |
|---|---|---|---|---|
| 4,506,949 A | * | 3/1985 | Knop | 359/568 |
| 4,908,339 A | * | 3/1990 | Blount | 501/32 |
| 5,009,484 A |   | 4/1991 | Gerritsen | |
| 5,116,461 A | * | 5/1992 | Lebby et al. | 216/2 |
| 5,630,902 A | * | 5/1997 | Galarneau et al. | 156/379.8 |
| 5,742,433 A | * | 4/1998 | Shiono et al. | 359/575 |
| 5,825,741 A | * | 10/1998 | Welch et al. | 369/112.08 |
| 6,079,228 A |   | 6/2000 | Tomisaka | |
| 6,579,477 B1 | * | 6/2003 | Belleville et al. | 264/1.7 |
| 2001/0008741 A1 | | 7/2001 | Tomita et al. | |
| 2003/0025223 A1 | | 2/2003 | Nakabayashi | |
| 2004/0251775 A1 | | 12/2004 | Choi et al. | |

FOREIGN PATENT DOCUMENTS

| | | |
|---|---|---|
| EP | 0 576 896 AI | 3/1993 |
| JP | 7146405 | 6/1995 |
| JP | 10096807 | 4/1998 |
| JP | 10232306 | 9/1998 |
| JP | 2000509168 | 7/2000 |

(Continued)

OTHER PUBLICATIONS

Wikipedia, "Curing (chemistry)", accessed at http://en.wikipedia.org/wiki/Curing_(chemistry) on Nov. 16, 2010.*

(Continued)

*Primary Examiner* — Yogendra Gupta
*Assistant Examiner* — Alison Hindenlang
(74) *Attorney, Agent, or Firm* — Fay Sharpe LLP

(57) ABSTRACT

An optical diffraction grating (10) is produced by providing a mold (50) having a plurality of inclined grooves (58), which have a small clearance angle (γ). The mold (50) is covered by a curable material (M1). Said material is subsequently cured, i.e. hardened, and separated from the mold (50) to provide the diffraction grating (10). The inclined orientation of the grooves (58) allows expansion or contraction of the grating during the curing and separation steps such that the probability of mold breakage may be reduced. The inclined orientation of the grooves may also facilitate the separation of the grating (10) from the mold (50).

15 Claims, 10 Drawing Sheets

FOREIGN PATENT DOCUMENTS

| | | |
|---|---|---|
| JP | 2005116069 | 4/2005 |
| JP | 2005208512 | 8/2005 |
| JP | 2005259235 | 9/2005 |
| WO | WO 2004/081620 | 9/2004 |

OTHER PUBLICATIONS

N. De Beaucoudrey et al., On the Design and Fabrication of High Efficiency Inclined Binary High Frequency Gratings, Proceedings of the SPIE, SPIE, US LNKD-DOI: 10.1117/12.246789, vol. 2775, May 13, 1996, pp. 533-537, XP008020728, Institut d'Optique Theorique et Appliquce (CNRS), Orsay, France, Dept. of Physics. Univ. of Joensuu, Joensuu, Finland.

Supplementary European Search Report, EP 05 81 2973, May 27, 2010, pp. 1-2.

* cited by examiner

METHOD OF PRODUCING A DIFFRACTION GRATING ELEMENT

The present invention relates to the production of optical diffraction gratings.

BACKGROUND OF THE INVENTION

Diffraction gratings are used in optics to couple light in or out from waveguiding structures. Diffraction gratings may also be used to provide angular dispersion of light comprising several wavelengths.

U.S. Pat. No. 6,579,477 discloses a method for fabricating diffractive optical components by replication using a matrix. The matrix is treated with a release agent. A substrate is treated with an adhesion promoter and covered with a copy material. The matrix is pressed to heated copy material in order to replicate the profile of the matrix.

U.S. Pat. No. 5,629,804 discloses a diffraction grating constituted by a substrate and a resin layer having a repetitive pattern formed on the substrate. The repetitive pattern is formed by hardening photo-curable resin in a mold.

U.S. Pat. No. 4,235,654 discloses a method for producing composite optical elements of glass and polymer material. A glass substrate is treated with a silanizing agent to activate its surface. An organic polymer material is applied to the activated surface with a mold platen forming the desired exterior configuration. The polymer material is cured, and the product, e.g. a diffraction grating, is subsequently released from the mold.

U.S. Pat. No. 5,742,433 discloses a diffractive optical device comprising a grating section, which has several different grating periods. According to the teachings of U.S. Pat. No. 5,742,433, the grating section may be mass-produced by forming a nickel mold by an electroforming method, and by duplicating the mold using UV curable resin.

SUMMARY OF THE INVENTION

The object of the present invention is to provide a method of producing optical diffraction gratings.

According to the present invention, a diffraction grating is produced by using a mold which has a plurality of adjacent microscopic grooves, the inclination of said grooves being greater than or equal to 20 degrees and smaller than or equal to 70 degrees with respect to the normal of the plane of the mold, the depth of the grooves being greater than or equal to 0.4 times the grating period of the mold, the grating period of said mold being greater than or equal to 0.2 µm and smaller than or equal to 10 µm, and the clearance angle of said grooves being greater than 0 degrees and smaller than or equal to 20 degrees.

The method of producing the diffraction grating comprises at least:
  applying an anti-adhesion layer to said mold to facilitate separation of the diffraction grating from said mold,
  applying curable substance to said mold,
  curing said substance at least partially to produce the diffraction grating, and
  separating said diffraction grating 10 from said mold.

The optical diffraction grating is produced by providing a mold having a plurality of relatively deep inclined grooves, which have a relatively small clearance angle. The mold is covered with an anti-adhesion layer. The mold is covered with a curable material which is subsequently cured, i.e. hardened, and separated from the mold to provide the diffraction grating.

The inclined orientation of the grooves allows lateral expansion and/or contraction of the grating during the curing and/or separation steps such that the probability of mold breakage may be reduced. The inclined orientation of the grooves may also facilitate the separation of the diffraction grating from the mold.

Thanks to the reduced probability of mold breakage, the method according to the present invention is suitable for mass production of optical diffraction gratings using molds which have a low clearance angle, and which have a relatively great groove depth with respect to the grating period.

The embodiments of the invention and their benefits will become more apparent to a person skilled in the art through the description and examples given herein below, and also through the appended claims.

BRIEF DESCRIPTION OF THE FIGURES

In the following examples, the embodiments of the invention will be described in more detail with reference to the appended drawings, in which.

DETAILED DESCRIPTION

Figure 1:
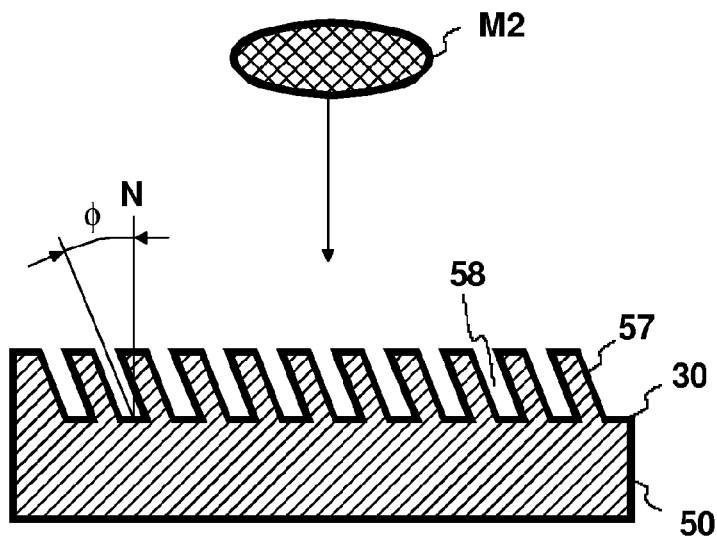
FIG. 1 shows schematically a mold for producing diffraction gratings, and the step of applying an anti-adhesive layer to said mold.

Referring to FIG. 1, a mold 50 according to the present invention comprises a profiled surface consisting of a plurality of inclined micro-protrusions 57. The micro-protrusions 57 define a plurality of microgrooves 58 between them. The mold may be e.g. silica ($SiO_2$) plate. A mask may be implemented on the surface of the plate by e.g. electron beam lithography, and the surface relief may be implemented on the masked surface by e.g. reactive ion etching (RIE) or reactive ion beam etching (RIBE).

Anti-adhesion agent M2 is applied to the mold surface in order to implement an anti-adhesion layer 30. The anti-adhesion layer 30 facilitates later removal of the produced grating from the mold 50.

The orientation of the microgrooves 58 with respect to the normal N of the profiled surface, i.e. the inclination angle $\phi$ is greater than or equal to 20° and smaller than or equal to 70°.

The mold 50 may also be nickel or chromium plate on which the relief is implemented by galvanic methods.

Figure 2:
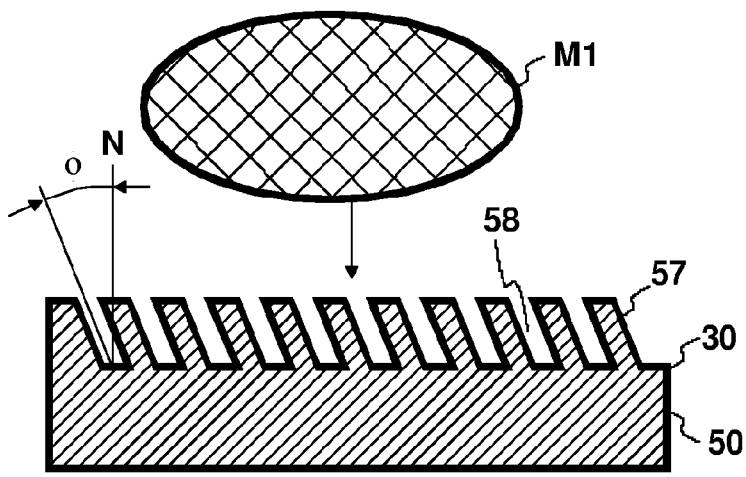
FIG. 2 shows schematically applying a curable substance to the mold.

Referring to FIG. 2, an amount of curable substance M1 is applied to the profiled surface of the mold 50 in order to cover the surface. The substance M1 may be e.g. a droplet of thermally or UV-curable resin.

The substance M1 may be applied in vacuum in order to avoid entrainment of gas bubbles. The spreading of the substance M1 may be assisted by spinning the mold 50.

Figure 3:
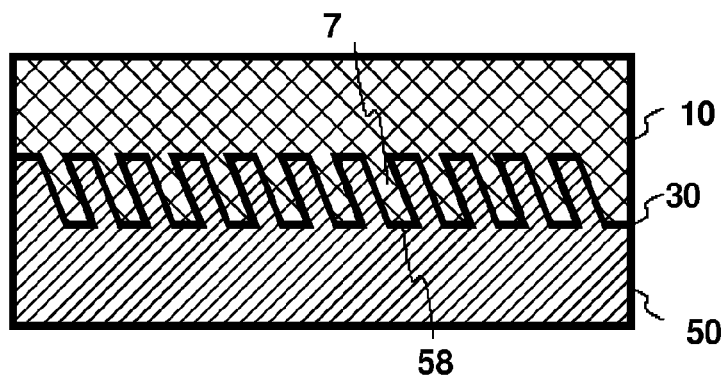
FIG. 3 shows schematically the curing of the curable substance in the mold.

Referring to FIG. 3, the curable substance M1 is cured in the mold 50 in order to form the diffraction grating 10. The substance and/or the mold 50 may be heated, or the substance may be exposed to UV radiation. The microgrooves 58 of the mold 50 define the form of the respective micro-protrusions of the grating 10.

Figure 4:
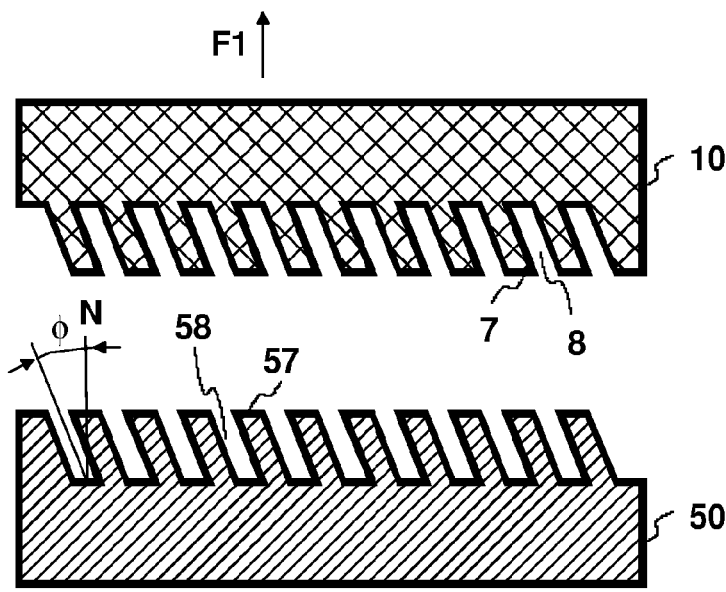
FIG. 4 shows schematically the produced diffraction grating and the mold.

Referring to FIG. 4, the diffraction grating 10 may be separated from the mold 50 by applying a separating force F1.

Figure 5:
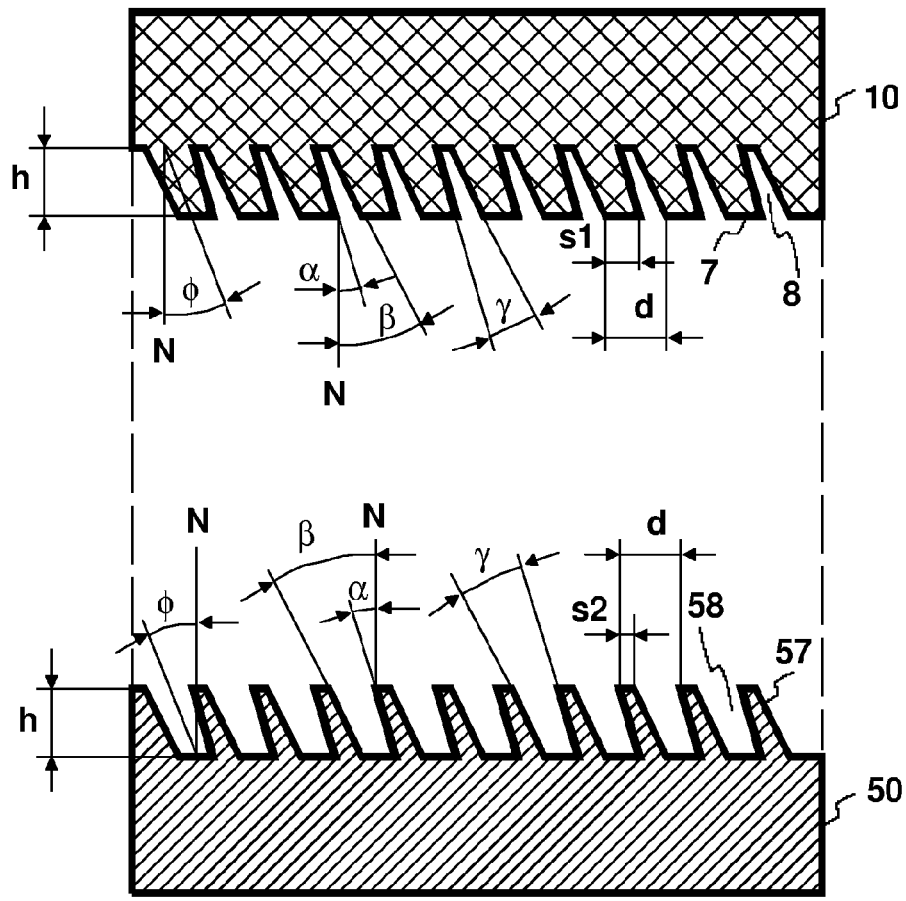
FIG. 5 shows schematically the dimensional parameters of the produced diffraction grating and of the mold.

Referring to FIG. 5, one side of the microgroove 58 of the mold 50 is at an angle $\alpha$ with respect to the normal N of the grating plane. The other side of the microgroove 58 is at an angle $\beta$ with respect to the normal N. The microgrooves 58 have a clearance angle $\gamma$ in order to facilitate the separation of the grating 10 from the mold 50. The clearance angle $\gamma$ is equal to the difference $\beta-\alpha$. The inclination angle of the protrusions 57 of the mold 50 is equal to the average of the angles $\alpha$ and $\beta$:

$$\phi = \frac{\alpha + \beta}{2}. \tag{1}$$

h denotes the depth of the microgrooves 57 of the mold 50. The grating constant d denotes the distance between the positions of the adjacent microgrooves 58. s2 denotes the width of the top of the micro-protrusions 57 of the mold 50. s1 denotes the width of the top of the micro-protrusions 7 of the produced diffraction grating 10. The filling factor c1 of the diffraction grating 10 is defined as:

$$c1 = \frac{s1}{d}. \tag{2}$$

The filling factor c2 of the mold 50 is defined respectively as:

$$c2 = \frac{s2}{d}. \tag{3}$$

The filling factors c1 and c2 may be e.g. in the range 0.2 to 0.8. The grating period may be e.g. in the range of 0.2 µm to 10 µm.

According to the present invention the parameters of the mold 50 are as follows:
   the inclination angle $\phi$ is greater than or equal to 20° and smaller than or equal to 70°,
   the clearance angle $\gamma$ is greater than or equal to 0° and smaller than or equal to 20°, and
   the ratio of the depth h to the grating period d is greater than or equal to 0.4.

Advantageously, the parameters of the mold 50 are as follows:
   inclination angle $\phi$ is greater than or equal to 25° and smaller than or equal to 45°.
   the clearance angle $\gamma$ is greater than or equal to 5° and smaller than or equal to 12°, and
   the ratio of the depth h to the grating period d is greater than or equal to 0.6.

Said range 25° to 45° represents an optimum with respect to the production of the mold 50, and with respect to the separation of the grating 10 from the mold 50.

The parameter values $\alpha$, $\beta$, $\phi$, $\gamma$, d and h of the produced diffraction grating 10 are substantially equal to the respective values of the mold 50.

Figure 6:
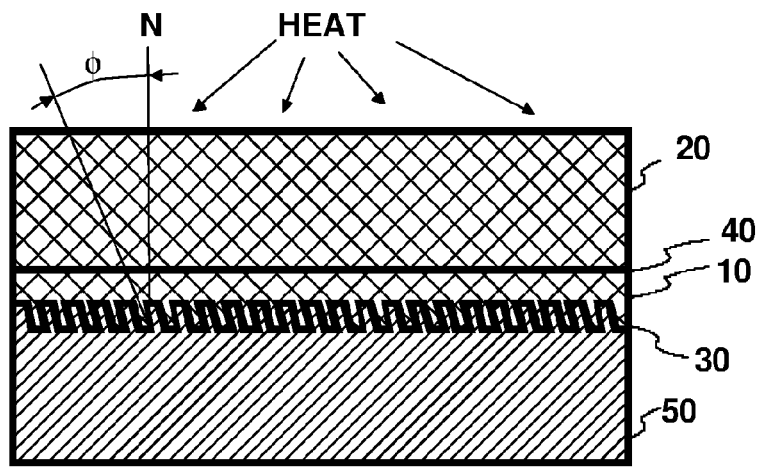
FIG. 6 shows schematically the producing of the diffraction grating by using thermally curable substance.

According to an embodiment shown in FIG. 6, the diffraction grating 10 is produced using a heat-curable resinous composition. The mold 50 having the inclined microgrooves 58 is produced by etching a plate of silica $SiO_2$ by reactive ion beam etching (RIBE). A chromium mask having thickness 10 to 100 nm may be implemented on the silica plate prior to the etching process to define the grating pattern.

The surface of the mold 50 is covered with an anti-adhesion layer 30, which may be applied as follows:
   A 0.2% solution of tridecafluoro-1,1,2,2-tetrahydro-octyl-trichlorosilane is prepared by using methyl-nonafluoro-butylether as the solvent
   The silica mold 50 is immersed in the above-mentioned solution for 10 minutes.
   The silica mold 50 is immersed in methyl-nonafluoro-butylether for 10 minutes.
   The mold is dried in nitrogen atmosphere.

The chemical formula of tridecafluoro-1, 1,2,2-tetrahydro-octyl-trichlorosilane is $CF_3(CF_2)_5(CH_2)2SiCl_3$. Methyl-nonafluoro-butylether is commercially available under the trade name "HFE-1700" by the company "3M Minnesota Mining & Manufacturing Co".

A substrate plate 20 having a thickness 0.5 to 3 mm may be manufactured by curing e.g. episulfide-based resinous composition. An optimum resinous composition may be selected e.g. from examples disclosed in U.S. Pat. No. 6,117,923. The episulfide-based resinous composition is cured thermally by heating.

The cured resinous composition may have a relatively high refractive index and low optical absorbance.

Next, an amount of the episulfide-based resinous composition is positioned between the mold 50 and the substrate 20 such that the gap between is filled. Again, the resinous composition is cured thermally by heating. Consequently, the grating 10 is joined to the plate 20.

The produced diffraction grating 10 may be separated from the mold 50 by lifting the edge of the substrate plate 20. The substrate improves the mechanical strength of the diffraction grating 10 and facilitates the separation from the mold 50.

The diffraction grating 10 may be separated from the mold 50 when the substance M1 of the grating 10 is still in semi-hardened state. In other words, the substance may be only partially cured. Consequently, the protrusions 7 of the grating 10 are soft and flexible, which facilitates the separation of the grating 10 from the mold 50 and further reduces the probability of mold breakage. A further advantage associated with the separation in the semi-hardened state is that production rate may be increased. The grating 10 may be fully hardened at a later stage, e.g. in an oven. The substance M1 of the grating 10 may also be completely cured i.e. completely hardened in the mold 50.

The protrusions 7 of the grating 10 may be kept soft and flexible also by heating. Thus, the diffraction grating 10 may be separated from the mold 50 when the grating 10 is warm or heated. The temperature of the grating 10 may be e.g. greater than or equal to 50° C.

Figure 7:
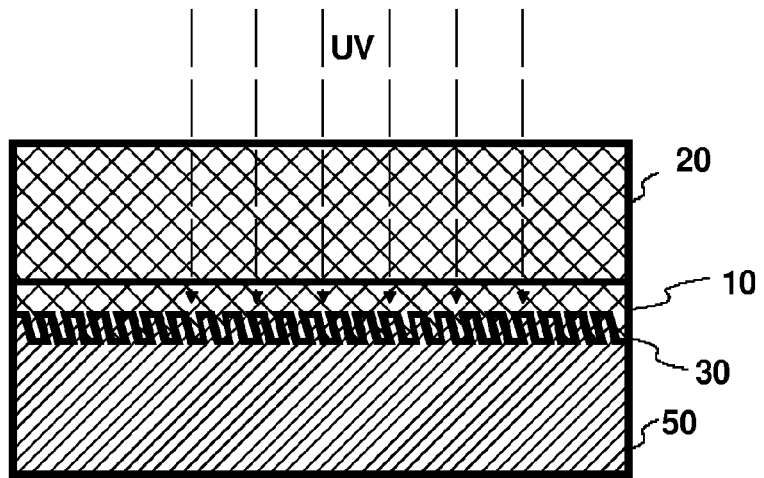
FIG. 7 shows schematically the producing of the diffraction grating by using UV curable substance.

According to an embodiment shown in FIG. 7, the diffraction grating 10 may be produced using a UV-curable substance. For example, a material under the trade name "NOA61" by the company "Norland Products" may be used. The mold 50 is produced and coated with the anti-adhesive layer as described above. An amount of "NOA61" is positioned between the substrate 20 and the mould 50, and cured by UV (ultraviolet) radiation. The substrate may be e.g. polycarbonate or acrylate polymer. The substrate 20 or the mold 50 has to be transparent to UV radiation. The surface of the substrate 20 may be activated to improve adhesion between the substrate 20 and the grating 10. A further primer layer may be used to improve adhesion between the substrate 20 and the grating 10.

The fabrication of a silica mold and the use of UV-curable acrylates is also disclosed in an article "3D microstructure replication processes using UV-curable acrylates", by C. Elsner, J. Dienelt, and D. Hirsch, Microelectronics Engineering Vol. 65 (2003) pp. 163-170. Also other UV-curable substances provided e.g. by a company "Mitsubishi Gas Chemical Company Inc" may be used.

The anti-adhesive layer 30 may also be implemented by plasma polymerization or ion sputtering of fluoropolymer films.

Also UV-curable materials may be removed from the mold in the semi-hardened state, and the curing of the substance may be completed at a later stage.

The separation of the diffraction grating 10 from the mold 50 is facilitated by joining the slightly flexible substrate plate 20 to the diffraction grating 10, which allows the combination of the diffraction grating 10 and the substrate 20 to slightly bend in the separation step. The thickness of the substrate may be smaller than or equal to 0.1 times the width of the diffraction grating 10 to be produced, in order to allow bending.

Figure 8:
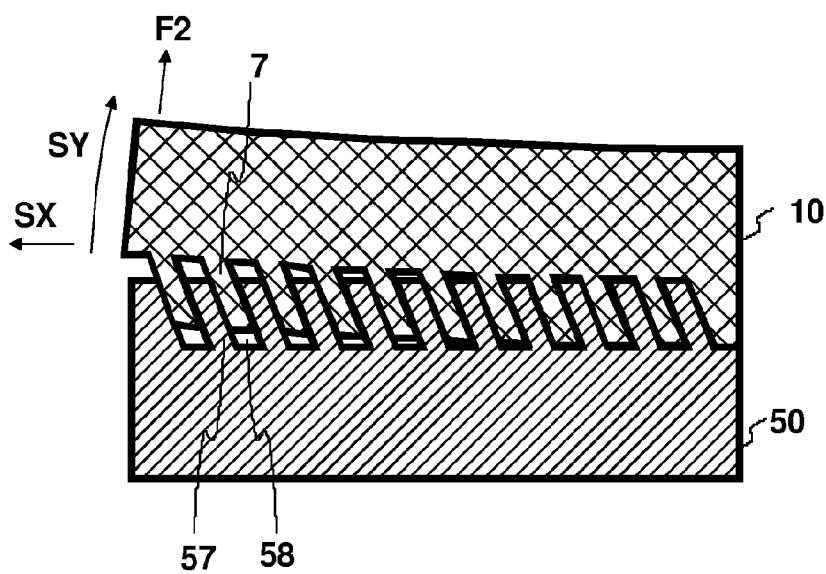
FIG. 8 shows schematically the separation of the produced diffraction grating from the mold by applying a separating force to the edge of the grating.

Referring to FIG. 8, the diffraction grating 10 and the mold 50 may be separated by directing a separating force F2 only to the edge or to the corner of the substrate 20, i.e. by pulling the edge. The slight bending of the combination of the diffraction grating 10 and the substrate 20 is advantageous, as it substantially reduces the forces needed to separate the diffraction grating 10 from the mould 50. Thus, one does not need to overcome the adhesive force of the whole area at a time.

It should be noticed that when the diffraction grating 10 is bent, the bottom side of the diffraction grating 10 on the mold side is slightly expanded, which causes a slight sideways displacement of the grating 10 in the direction SX. However, the protrusions 7 of the diffraction grating 10 may slide in the microgrooves 58 of the mold 50 such that the sideways displacement may result as a local separation of the grating 10 and the mold 50, instead of damaging the mold 50 and/or the grating 10.

Figure 9A:
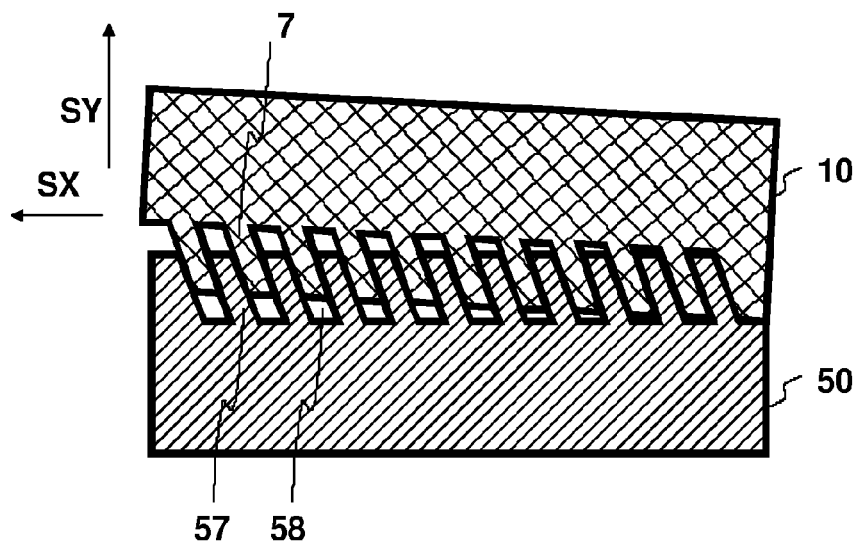
FIG. 9a shows schematically the behavior of the diffraction grating when the curable substance expands with respect to the mold.

The diffraction grating 10 may expand or contract also due to chemical reactions and/or thermal expansion. Also in that case the micro-protrusions 7, 57 are subject to lateral forces. Referring to FIG. 9a, when the diffraction grating is expanded, the protrusions 7 of the diffraction grating 10 may slide in the microgrooves 58 of the mold 50 such that the sideways displacement may result as a local separation of the grating 10 and the mold 50, instead of damaging the mold 50 and/or the grating 10.

Figure 9B:
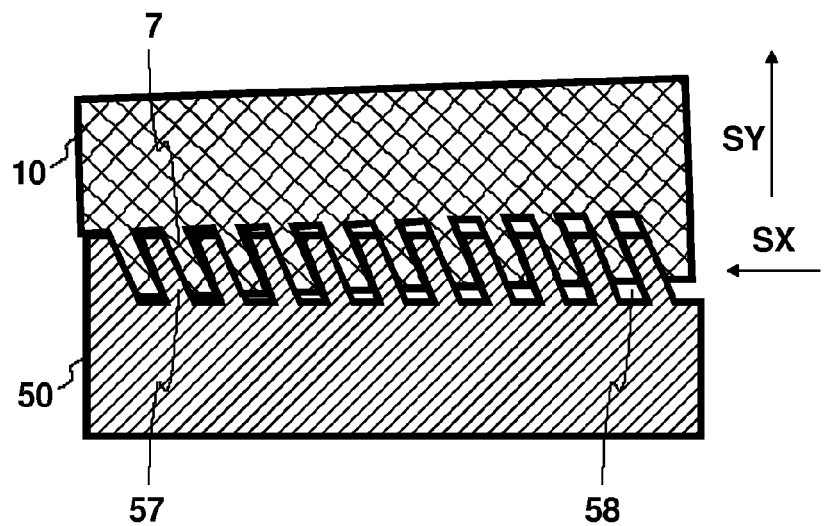
FIG. 9b shows schematically the behavior of the diffraction grating when the curable substance contracts with respect to the mold.

Referring to FIG. 9b, the substance of the grating 10 may also contract when it is cured. The protrusions 7 of the diffraction grating 10 may slide in the microgrooves 58 of the mold 50 such that the sideways displacement may result as a local separation of the grating 10 and the mold 50, instead of damaging the mold 50 and/or the grating 10. Thus, the inclined microgrooves 58 may also facilitate the separation of the grating 10 from the mold 50. It may be that the structure is pre-stressed due to the contraction such that just a small impact or very small separative movement is enough to completely separate the grating 10 from the mold 50, without a need to apply a great and external separative force. In other words, thanks to the inclined orientation of the microgrooves 58, the separation may be surprisingly easy.

Figure 10:
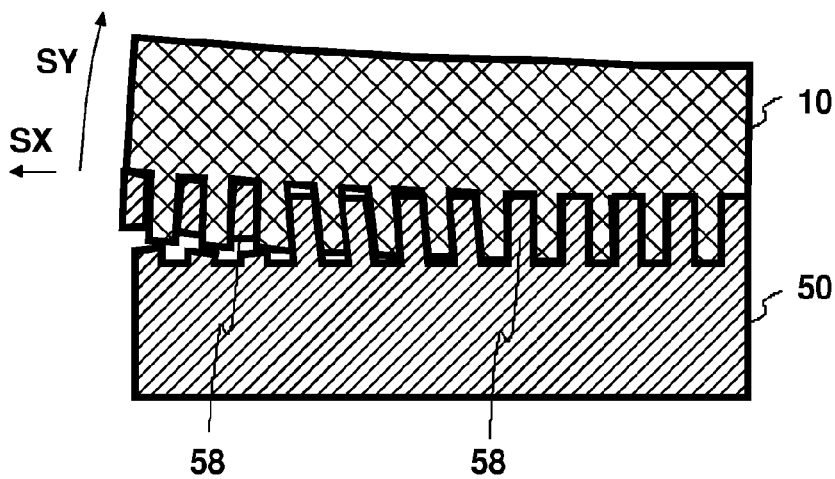
FIG. 10 shows schematically the breaking of the mold due to bending and/or expansion of the grating, when the micro-grooves of the mold are substantially perpendicular to the plane of the grating.

Referring to a comparative example shown in FIG. 10, the expansion of the grating 10 may lead to breaking of the mold 50 if the microgrooves 58 are substantially perpendicular to the grating plane, and the clearance angle is small. Also the produced grating 10 may be damaged. Furthermore, the broken pieces of the protrusions may clog one or more microgrooves of the mold 50.

Thus, the method according to the present invention reduces the probability that the mold 50 is damaged during the curing and/or separation steps due to lateral deformations. Thermal expansion/contraction, expansion/contraction due to chemical reactions, and expansion/contraction due to bending may now be allowed due to the inclined orientation of the microgrooves 58.

Figure 11:
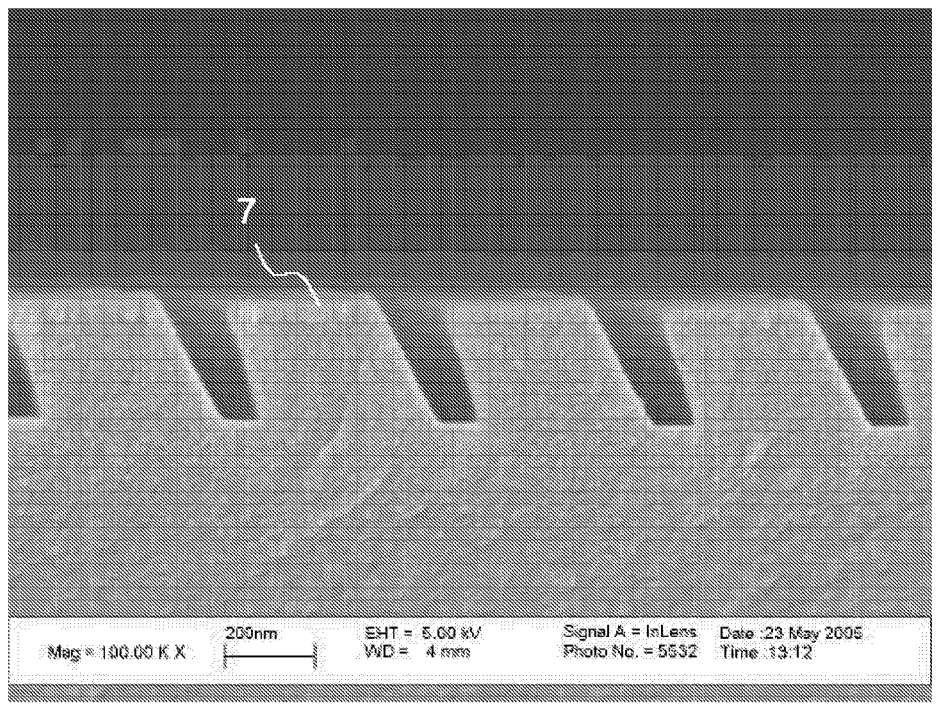
FIG. 11 shows, by way of example, a microscope image of the cross section of a produced diffraction grating, the inclination angle of the grating being 25°.

FIG. 11 shows a microscope image of a diffraction grating produced by a method according to the present invention. The grating is made of episulfide-based resinous composition. The inclination angle of the protrusions is 25°, the height of the protrusions is 261 nm, the grating period is 480 nm, the fill factor is 0.66, and the clearance angle is 10°.

Figure 12:
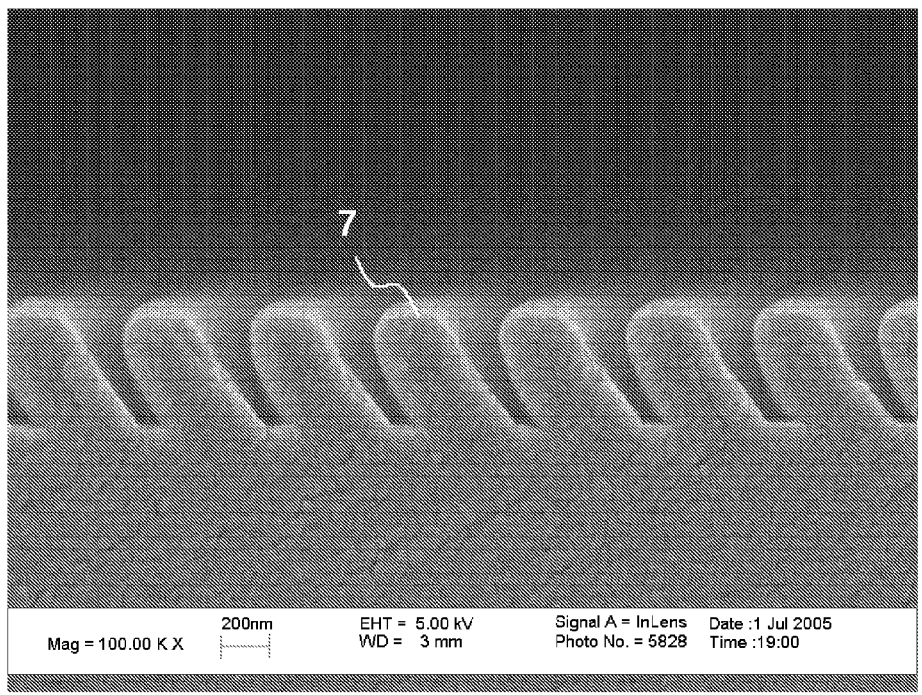
FIG. 12 shows, by way of example, a microscope image of the cross section of a produced diffraction grating, the inclination angle of the grating being 35°.

FIG. 12 shows a microscope image of a diffraction grating produced by a method according to the present invention. The grating is made of episulfide-based resinous composition. The inclination angle of the protrusions is 35°. The tops of the protrusions have a rounded form in order to further facilitate separation of the grating from the mold.

Figure 13:
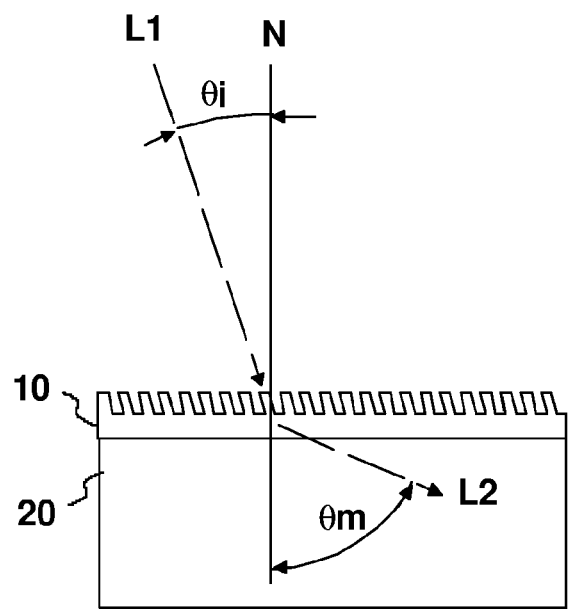
FIG. 13 shows schematically the diffraction of a light beam by using the produced diffraction grating.

Referring to FIG. 13, the directions of the diffracted light beams are governed by the diffraction equation:

$$\sin\theta_m = n\sin\theta_i + \frac{m\lambda}{d} \quad (4)$$

where m is the diffraction order (an integer assuming values . . . −3, −2, −1, 0, 1, 2, 3 . . . ), λ is the wavelength of the incident light, $\theta_i$ is the angle between the direction of the light impinging on the grating and the surface normal N, and $\theta_m$ is the angle between direction of the diffracted light and the surface normal N. n is the refractive index of the grating material. L1 denotes the incoming light beam and L2 denotes one of the diffracted beams.

The produced diffraction grating 10 may be used to change the direction of a light beam L1 impinging on the grating 10. The produced diffraction grating 10 may also be used to provide angular dispersion of light impinging on the grating 10, said light comprising several wavelengths.

The grating period d, the groove depth h, the filling factor c1, and the inclination angle φ are selected according to the optical application. For example, the parameters α, γd, c1, and h may be selected to provide maximum diffraction efficiency in the diffraction order m=2 or m=−2 (minus two), or at diffraction orders m=3 or m=−3.

The minimization of the clearance angle may provide best optical performance, but may also increase the probability of mold breakage. The optimum clearance angle γ may be established by a series of experimental tests.

Figure 14:
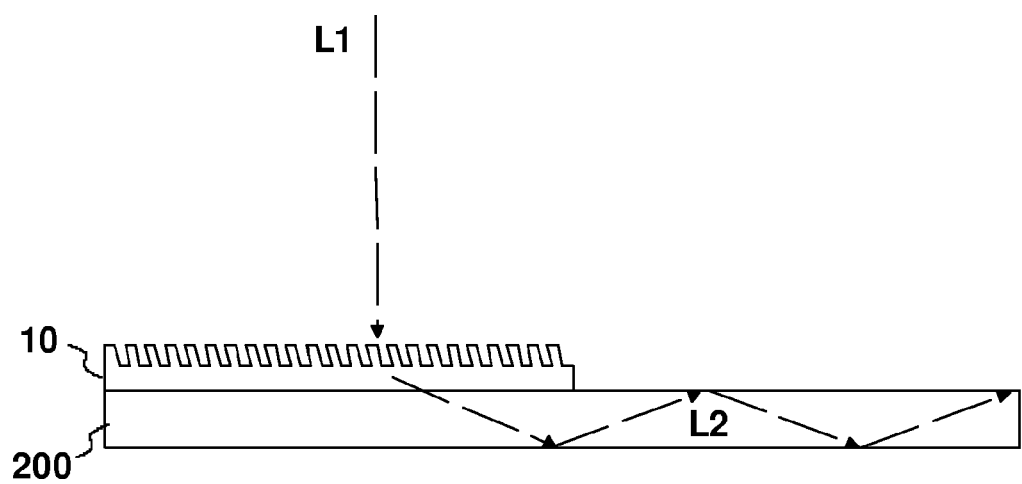
FIG. 14 shows schematically the coupling of a light beam into an optical waveguide by using the produced diffraction grating.

Referring to FIG. 14, the diffraction grating 10 produced according to the present invention may be optimized and used e.g. to couple light L1 into an optical waveguide 200. The direction of propagation of the light L1 may be substantially perpendicular to the waveguide 200. The direction of the light is changed by the grating 10 such that the diffracted light L2 is confined within the waveguide 200. The waveguide 200 may further comprise a cladding layer (not shown)

Figure 15:
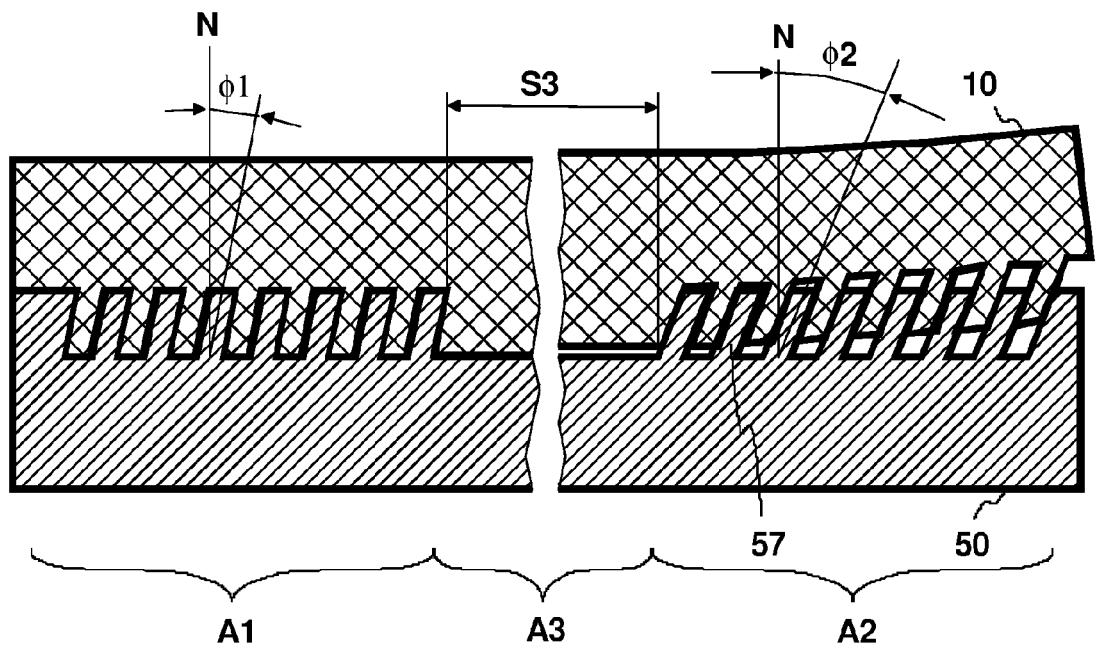
FIG. 15 shows schematically a diffraction grating comprising two or more micro-structured areas, which have different inclination angles of the micro-protrusions.

Referring to FIG. 15, the mold 50 may comprise several micro structured areas A1, A2, in which the inclination angles φ1, φ2 of the microgrooves 58 are different. For example, in a first micro structured area A1, the inclination angle φ1 may be 10°, and in a second micro structured area A2, the inclination angle φ2 may be 20°. Also in this case the expansion of the grating 10 leads to separation of the grating 10 from the mould 50, instead of breaking the protrusions 57 of the mold 50. There may be third non-structured A3 area between the areas A1 and A2 in order to allow separation of the grating 10 from the mold 50. The width s3 of the non-structured area A3 may be e.g. 50 times the grating period d.

The difference between the inclination angles of adjacent microgrooves 58 may also be so small that the intermediate area A3 is not needed. Thus, the grating 10 may be separated from the mold 50 thanks to the expansion or contraction of the curable substance. The micro-protrusions 7 may also be slightly flexible when they are in the heated and/or semi-hardened state, which facilitates the separation when the adjacent microgrooves 58 have different inclination angles.

Figure 16:
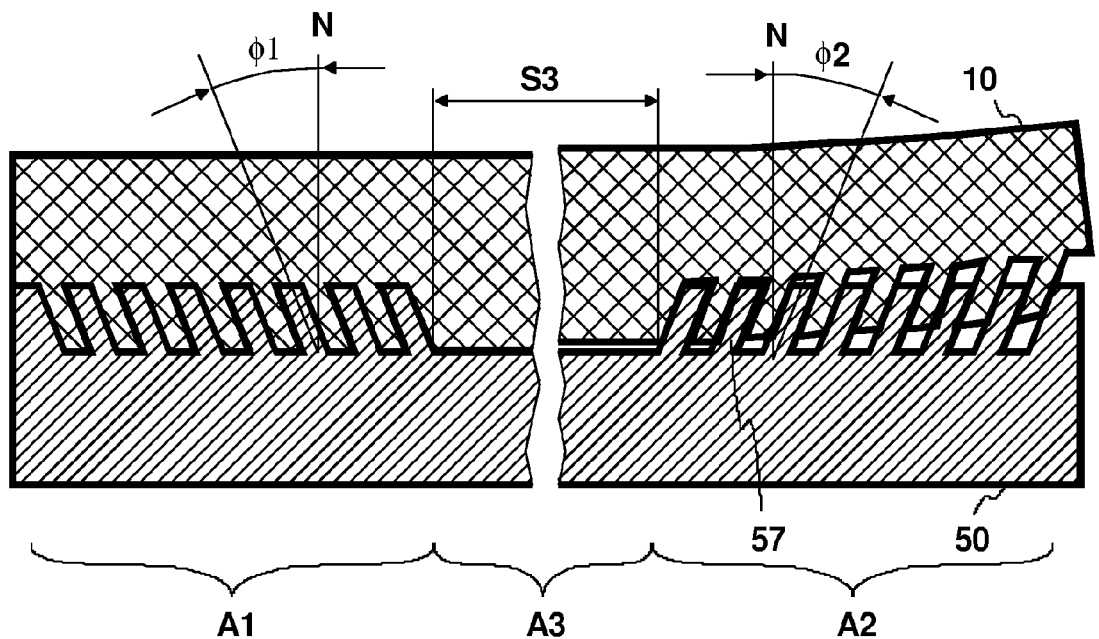
FIG. 16 shows schematically a diffraction grating comprising two or more micro-structured areas, the inclination angle of the micro-protrusions in a first area being positive and the inclination angle of the micro-protrusions in a second area being negative.

Referring to FIG. 16, the microgrooves may be inclined to opposite directions, e.g. the inclination angle φ1 may be 20° anti-clockwise in the first area A1 and the inclination angle φ2 may be 20° clockwise in the second area A1.

Figure 17:
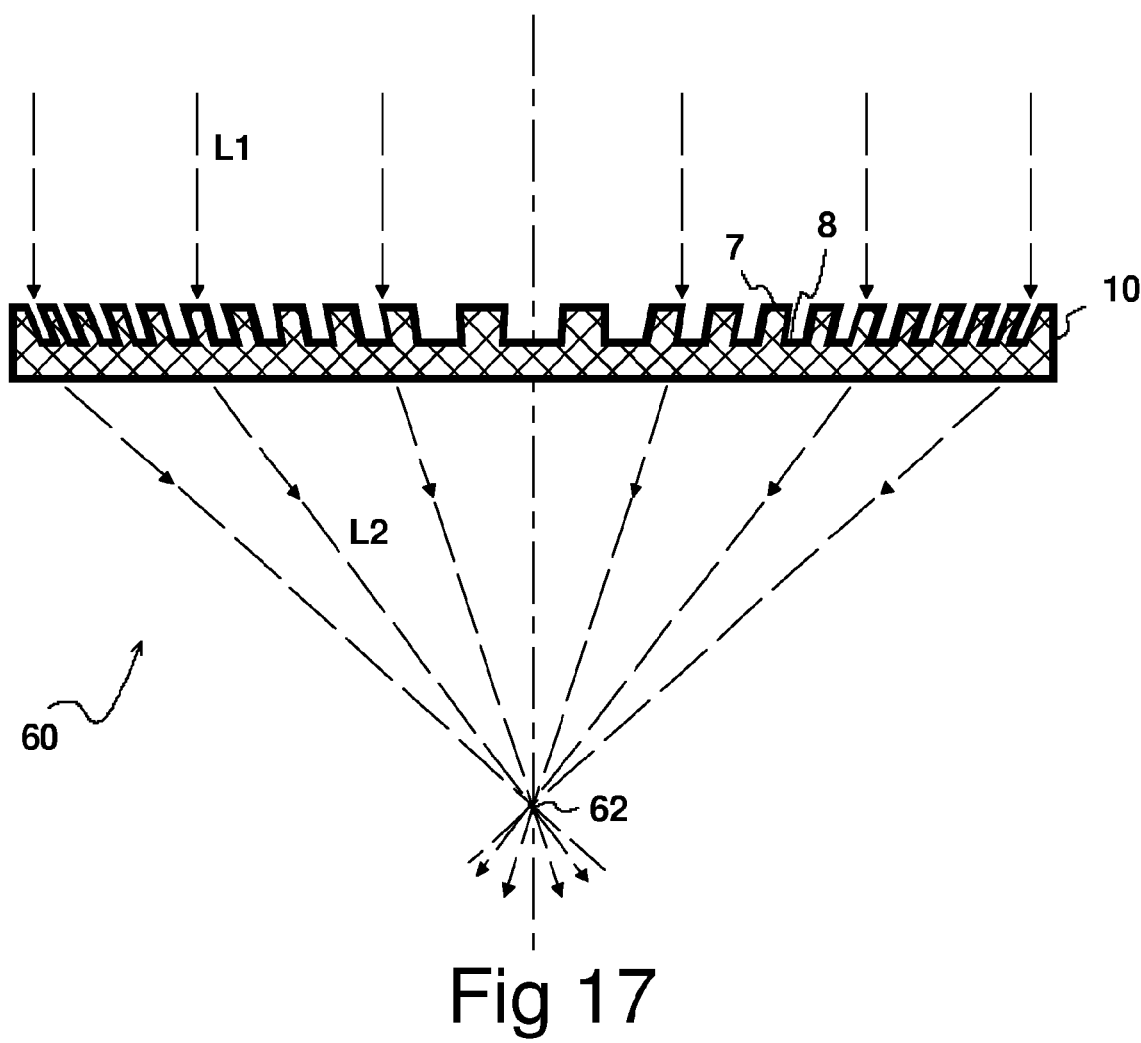
FIG. 17 shows schematically a diffractive lens.

Referring to FIG. 17, the diffraction grating 10 may be used implement a diffractive lens 60, which directs light by diffraction. The diffractive lens 60 may be used e.g. for imaging and/or to focus parallel light rays L1 to a focal point 62.

Figure 18:
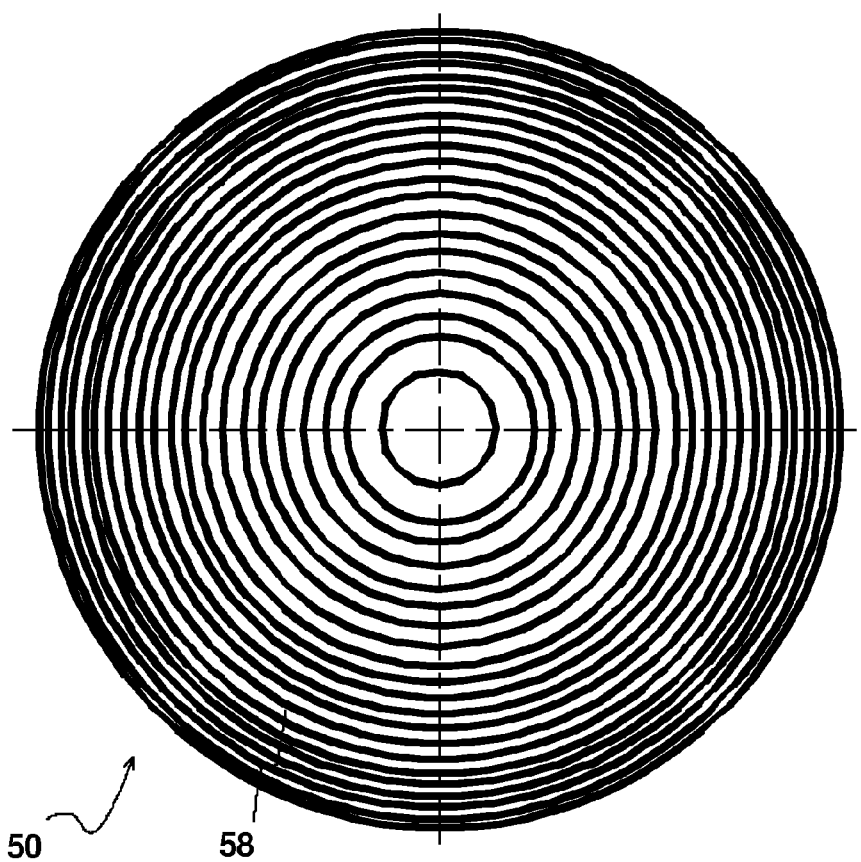
FIG. 18 shows schematically a top view of a mold for producing the diffractive lens according to FIG. 17.

Referring to FIG. 18 the mold 50 for producing the diffractive lens 60 according to FIG. 17 may comprise circular and/or curved microgrooves 58.

Figure 19:
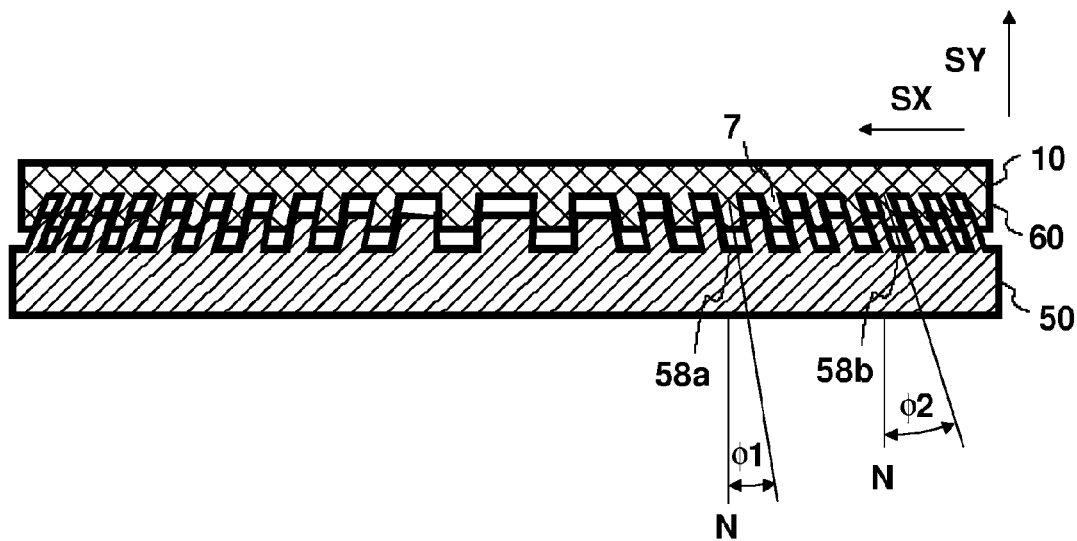
FIG. 19 shows schematically the contraction of the diffractive lens in the mold.

The substance of the diffraction grating may contract when said substance is cured. Referring to FIG. 19, the inclined orientation of the microgrooves 58a, 58b may facilitate the separation of the diffraction grating 10 from the mold 50 and/or to reduce the probability of mold breakage. The protrusions 7 of the grating 10 may slide in the microgrooves 58a, 58b. Thus a lateral movement of the grating edge in the direction SX may be associated with a separating movement in the direction SY when the substance is contracted.

Figure 20:
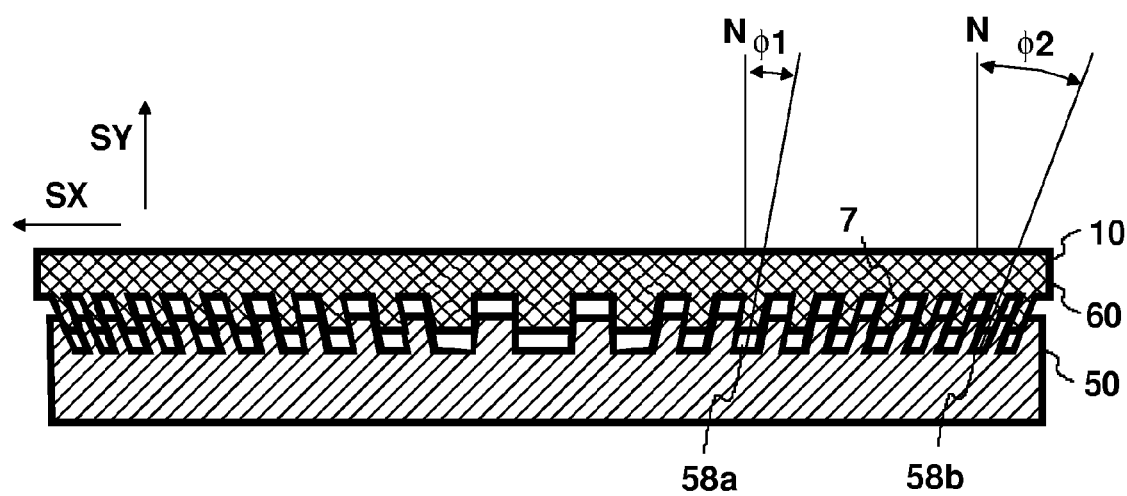
FIG. 20 shows schematically the expansion of the diffractive lens in the mold

Referring to FIG. 20, the relative orientation of the microgrooves 58 may also be such that a slight expansion of the diffractive lens 60 is required for the separation of the lens 60 from the mold 50. The curable material of the lens may be expanded e.g. by heating. The diffractive lens 60 may be a diverging lens, i.e. it may have a negative focal length. The protrusions 7 of the grating 10 may slide in the microgrooves 58a, 58b, and the lateral movement of the grating edge in the direction SX may be associated with a separating movement in the direction SY when the curable substance of the lens 60 is expanded.

In the cases according to FIGS. 19 and 20, the variation of the inclination angles is gradual, i.e. the difference between the inclination angles of adjacent microgrooves 58 is very small.

In general, the form and/or divergence and/or direction of a light beam may be modified using a diffractive beam shaping element, said beam shaping element comprising inclined diffractive protrusions.

Thanks to the reduced probability of mold breakage, the method according to the present invention is especially suitable for mass production of optical diffraction gratings having a low clearance angle.

The dimensions of the diffraction gratings 10 and the molds 50 have been exaggerated in the schematic drawings 1 to 10 and 13 to 19. Actual diffraction gratings 10 and molds 50 may comprise several thousands of protrusions 7 and microgrooves 58.

For a person skilled in the art, it will be clear that modifications and variations of the devices and the method according to the present invention are perceivable. The particular embodiments described above with reference to the accompanying drawings are illustrative only and not meant to limit the scope of the invention, which is defined by the appended claims.

The invention claimed is:

1. A method of producing a diffraction grating by using a mold, which mold has a plurality of adjacent microscopic grooves, the inclination (φ) of said grooves being greater than or equal to 20 degrees and smaller than or equal to 70 degrees with respect to the normal (N) of the plane of the mold, the depth (h) of the grooves being greater than or equal to 0.4 times the grating period of the mold, the grating period of said mold being greater than or equal to 0.2 μm and smaller than or equal to 10 μm, and the clearance angle (γ) of said grooves being greater than or equal to 5 degrees and smaller than or equal to 20 degrees, said method comprising at least:
  applying an anti-adhesion layer to said mold to facilitate separation of the diffraction grating from said mold,
  applying curable substance to said mold,
  curing said substance at least partially to produce the diffraction grating, and
  separating said diffraction grating from said mold.

2. The method according to claim 1, wherein the inclination (φ) of said grooves is greater than or equal to 25 degrees and smaller than or equal to 45 degrees with respect to the normal (N) of the plane of the mold.

3. The method according to claim 1, wherein the clearance angle (γ) of said grooves is greater than or equal to 5 degrees and smaller than or equal to 12 degrees.

4. The method according claim 1, wherein the filling factor (c2) of the mold is greater than or equal to 0.2 and smaller than or equal to 0.8.

5. The method according to claim 1, wherein the depth (h) of the grooves is greater than or equal to 0.6 times the grating period (d).

6. The method according to claim , wherein said substance is cured by heat.

7. The method according to claim 6 wherein said diffraction grating is separated from said mold when the temperature of the substance of the grating is greater than or equal to 50° C.

8. The method according to claim 1 wherein said substance is cured by UV radiation.

9. The method according to claim 1 wherein said diffraction grating is separated from said mold when the substance of the grating is in semi-hardened state.

10. The method according to claim 1 further comprising joining a substrate plate to said diffraction grating.

11. The method according to claim 10 wherein the diffraction grating is separated from said mold by directing a separating force to the corner and/or edge of said substrate plate.

12. The method according to claim 10 wherein said substrate plate is flexible.

13. The method according to claim 10 further comprising treating said substrate plate with an adhesion promoting agent.

14. The method according to claim 1 wherein said mold comprises at least a first groove having a first inclination (φ1), and a second groove having a second inclination (φ2), said first inclination (φ1) being different from said second inclination (φ2).

15. The method according to claim 1 wherein at least one area of the mold comprises curved and/or circular grooves.

* * * * *